United States Patent [19]
Wagner

[11] 3,962,047
[45] June 8, 1976

[54] METHOD FOR SELECTIVELY CONTROLLING PLATING THICKNESSES

[75] Inventor: Robert Wagner, Scottsdale, Ariz.

[73] Assignee: Motorola, Inc., Chicago, Ill.

[22] Filed: Mar. 31, 1975

[21] Appl. No.: 563,555

[52] U.S. Cl............................ 204/15; 204/DIG. 7; 204/27
[51] Int. Cl.².................... C25D 5/02; C25D 7/00
[58] Field of Search.................. 204/DIG. 7, 15, 27, 204/224, 297 W

[56] References Cited
UNITED STATES PATENTS

| | | | |
|---|---|---|---|
| 1,519,572 | 12/1924 | Wolf | 4/DIG. 7 |
| 1,700,178 | 1/1929 | Porzell | 204/DIG. 7 |
| 3,743,583 | 7/1973 | Castonguay | 204/DIG. 7 |

FOREIGN PATENTS OR APPLICATIONS

| | | | |
|---|---|---|---|
| 607,024 | 6/1926 | France | 204/DIG. 7 |
| 561,230 | 9/1932 | Germany | 204/DIG. 7 |
| 255,691 | 7/1926 | United Kingdom | 204/DIG. 3 |

Primary Examiner—T. M. Tufariello
Attorney, Agent, or Firm—Lowell E. Clark; Harry M. Weiss

[57] ABSTRACT

A method for selectively controlling the plating thickness on opposing sides of a body is disclosed. The method comprises providing an assembly of the body to be plated, a shield having apertures therein and a sealing member between body to be plated and the shield. The sealing member has an opening to allow plating solution to reach one surface of the body to be plated and has further openings to allow gases and depleted solution to escape from the assembly. The process provides a thinner layer of plated metal on the inner surface of the body to be plated and a thicker layer in the outer surface. It is particularly useful in plating ceramic circuit boards.

9 Claims, 4 Drawing Figures

METHOD FOR SELECTIVELY CONTROLLING PLATING THICKNESSES

BACKGROUND OF THE INVENTION

This invention relates to a method for selectively controlling the plating thickness on opposing sides of a body. More particularly, this invention relates to a method for simultaneously depositing metallic coatings on opposing sides of a substrate, the deposited coating being thinner on one side than the other.

It is often desirable to provide opposing sides of a substrate with a metal coating wherein the thickness of the coating is not equal on both sides. Various methods have been employed in the prior art in order to achieve this result. For example, one approach is an anode shielding method wherein a nonconductive shield is placed between the surface of the body upon which the thinner coating is desired and the anode. While theoretically this serves to increase the electrical resistance between the anode and the substrate, it has not been found to achieve the desired results in practice.

Accordingly, prior art researchers resorted to separate plating steps wherein each surface is masked while plating is carried out on the opposing surface. While providing the desired results, this approach requires two separate plating operations with additional steps of masking, etching, etc., required for each side.

Alternately, plating is carried out in one operation but the thicker of the desired coatings is applied to both sides. While this is usually not a detriment where inexpensive metals are plated, it is wasteful and uneconomical where expensive metals such as gold are employed.

SUMMARY OF THE INVENTION

The method according to this invention comprises providing an assembly comprising a substrate, a first body having a plurality of apertures therein, and a second body disposed between said substrate and said first body and contiguous with one surface of said substrate, the second body having an opening therein at least coextensive with the area to be plated on the first surface of the substrate and further including a plurality of openings disposed parallel to said substrate and extending from the first opening through the second body along one side thereof; and placing said assembly in a plating bath having a top surface so that said second openings are perpendicular to the top surface of the bath and plating essentially simultaneously on opposing surfaces of the substrate.

It has been found that the method of this invention allows one to readily control the thickness ratio of the opposing plated sides of the substrate with accurate predictability of results. Furthermore, this method is easy to operate and obviates the necessity of performing separate plating steps or other means of metal deposition on each side of the substrate. The method of the invention also provides economic advantages where precious metals are plated in view of the fact that the desired amount of metal can be plated on opposing sides of a substrate in one operation.

DETAILED DESCRIPTION OF THE INVENTION

Figure 1:
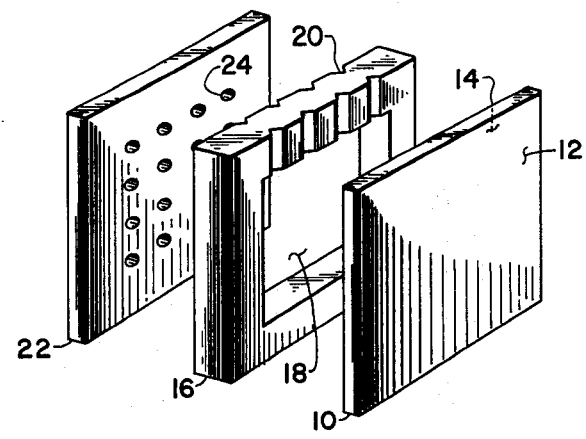
FIG. 1 is an exploded isometric view of an assembly for use in the method of this invention.

Referring to FIG. 1, there is shown a ceramic substrate 10 intended for use as a ceramic circuit board. Substrate 10 has a front surface 12 which has been previously metallized by any conventional means, such as evaporation etc., and patterned, for example, by the application of an appropriate photoresist, in order to allow deposition to provide the desired circuitry thereon. Rear surface 14 has also been metallized to provide a conductive surface. While substrate 10 is depicted as being made of ceramic in FIG. 1, it can comprise any body which is either inherently conductive or treated to become conductive, for example by providing conductive surfaces upon which it is desired to deposit a metal coating. The assembly further comprises a frameshaped sealing member 16 having an opening 18 which is at least coextensive with the area upon which it is desired to deposit metal on surface 14. Sealing member 16 also contains a series of grooves 20; the function of these grooves will be described below. Instead of grooves, holes communicating through the thickness of sealing member 16 in a direction parallel to substrate 10 can be provided. Sealing member 16 is made of any nonconductive material, for example, polytetrafluoroethyene, silicone rubber, etc. The assembly further comprises ceramic shield 22. Shield 22 can comprise any nonconductive material; for example any of the materials indicated as suitable for the sealing member can be used. Furthermore, shield 22 has a series of apertures 24 extending therethrough. When clamped together and placed in a plating bath as will be described in detail with reference to FIG. 2, plating solution flows through apertures 24 which control the thickness of deposition on surface 14. Gases given off in the plating process and depleted plating solution escape through the top of the assembly through grooves 20. The resulting continuous flow insures even deposition. By controlling the number and size of apertures 24, one can selectively deposit the desired thickness on surface 14. The surface 12 is exposed directly to the plating solution in the bath and hence receives a thicker layer of deposited metal.

Figure 4:
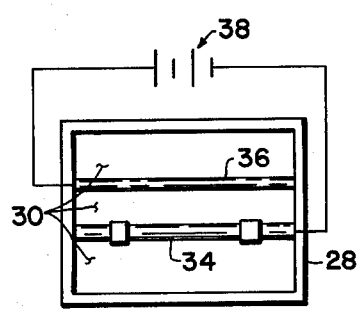
FIG. 4 is a top view of the plating bath of FIG. 2 showing electrical connections suitable for carrying out the method of this invention.
Figure 3:
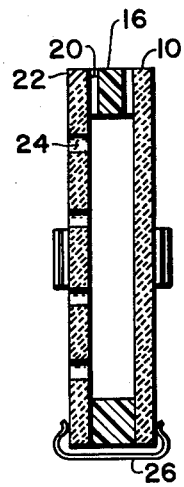
FIG. 3 is a sectional end view of the assembly taken along line 3—3 of FIG. 2.
Figure 2:
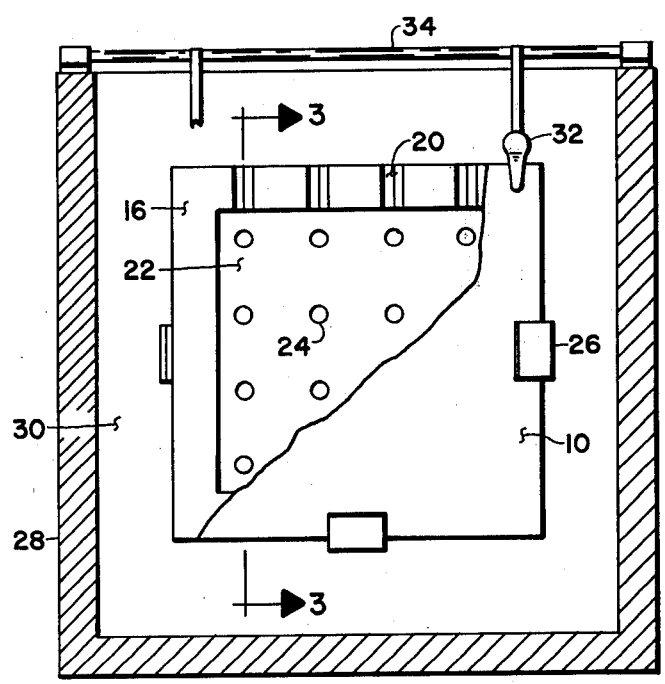
FIG. 2 is a side view of the assembly of FIG. 1 in a plating bath.

Referring now to FIG. 2, the assembly of FIG. 1 is clamped together by means of clamps 26 and placed in a housing 28 containing plating solution 30. The assembly further comprises means (not shown) for making electrical contact to surface 14; these means can comprise evaporative metal around the edge surfaces of substrate 10 or a conductive clip contacting surfaces 12 and 14. Clamps 26 are preferably made of a nonconductive material, such as described above with reference to sealing member 16. It is critical to the process of this invention that the assembly is positioned in the plating bath with the grooves 20 in sealing member 16 perpendicular to the top surface of the bath. The assembly is retained in the bath by alligator clamps 32 which are also attached to cathode 34; the remainder of the electrical connections are shown in FIG. 4 wherein anode 36 and cathode 34 are connected to a conventional power supply 38.

The invention will now be described in detail in terms of plating gold on opposing sides of a ceramic circuit board. Ceramic substrate 10 is provided having a front surface 12 whose surface area is 16 in$^2$. The surface has been previously metallized with successive layers of nichrome and gold and patterned with a photoresist according to conventional techniques; the exposed area covers 8 in$^2$. Rear surface 14 has also been previously metallized with nichrome and gold but is not patterned; it has an exposed surface area of 16 in$^2$. It will be apparent that other metals can be used to provide the desired conductive surfaces on substrate 10. Shield 22 has 250 apertures 24 each having a diameter of 0.03 in. Shield 22 is spaced about 150 mils from substrate 10 by means of sealing member 16. The apertures in shield 22 and the surface area of sealing member 16 contiguous with surface 14 of substrate 10 reduce the effective exposed surface area thereof to 3.63 in$^2$. A conventional gold bath of the cyanide type such as Aural 292M sold by LeaRonal Pacific Corp., 2901 South Alameda Street, Los Angeles, California, is employed as plating solution 30. Plating was carried out employing 0.16 amps for 64 minutes. The resulting board has a patterned thickness of 226 micro-inches on front surface 12 and a uniform thickness of 88 micro-inches on its rear surface 14. By varying the size and number of the apertures in the shield, thicknesses ranging from 50–600 micro-inches can be obtained on the rear surface, such thicknesses being particularly desirable for ceramic circuit boards.

While the invention has been described with reference to plating a pattern on the front surface and a continuous coating on the rear surface, the procedure can be reversed or both or neither of the surfaces can be patterned. Furthermore, any type of metal can be plated, such as copper, nickel, gold, silver, platinum, etc., although it is most advantageous to plate precious metals where cost-savings are most desirable. Also, the assembly can be constructed to provide deposited metal of any desired thickness on the plated substrate.

The method of this invention is applicable to substrates having various configurations, provided a seal between the substrate to be plated and the shield can be effected. For example, a cup could be provided with a decorative coating on its outer surface and a continuous coating on its inner surface. However, in the electronics applications it is preferred to plate substantially planar substrates.

Furthermore, although the substrate to be plated is depicted as being nonperforated, substrates having apertures therein can be plated according to this invention. In this embodiment, two substrates, each having conductive front and rear surfaces, are placed on either side of the sealing member, obviating the need of a shield. Plating solution flows through the apertures into the space defined by the sealing member resulting in a thinner coating on the rear surfaces and a thicker coating on the front surfaces of the respective substrates.

Although the invention has been described in connection with certain preferred embodiments, it is not intended that the invention be limited thereto. Thus, it is intended that the invention cover all alternatives, arrangements, equivalents, and embodiments as may be included in the scope of the following claims.

What is claimed is:

1. A method for selectively controlling the plating thickness on opposing sides of a substrate which comprises:

providing an assembly comprising said substrate having first and second opposing surfaces, a first body having a plurality of apertures therein, and a second body disposed between said substrate and said first body and contiguous with the first surface of said substrate, said second body sealing said substrate and said first body, said second body having a first opening therein at least coextensive with the area to be plated on the first surface of said substrate and further including a plurality of second openings disposed parallel to said substrate and extending from the first opening through said second body along one side thereof;

placing said assembly in a plating bath having a top surface so that said second openings are perpendicular to the top surface of the bath and plating essentially simultaneously on the first and second surfaces of said substrate.

2. The method of claim 1 wherein said second body forms a seal between said substrate and said first body.

3. The method of claim 1 wherein said substrate is conductive and said first and second bodies are nonconductive.

4. The method of claim 1 wherein said substrate is substantially planar.

5. The method of claim 1 wherein said substrate and said first body are substantially planar.

6. The method of claim 5 wherein said substrate is a ceramic circuit board.

7. The method of claim 1 wherein the second openings are grooves in said second body.

8. The method of claim 1 wherein said substrate has a plurality of apertures therein, and said first body comprises a second substrate having first and second surfaces parallel to the first and second surfaces of said substrate, and said plating is carried out on all first and second surfaces of said substrates.

9. The method of claim 8 wherein said substrate and said first body are conductive and said second body is nonconductive.

* * * * *